United States Patent [19]

Nagano

[11] Patent Number: 4,507,573

[45] Date of Patent: Mar. 26, 1985

[54] CURRENT SOURCE CIRCUIT FOR PRODUCING A SMALL VALUE OUTPUT CURRENT PROPORTIONAL TO AN INPUT CURRENT

[75] Inventor: Katsumi Nagano, Shimonoseki, Japan

[73] Assignee: Tokyo Shibaura Denki Kabushiki Kaisha, Kawasaki, Japan

[21] Appl. No.: 414,911

[22] Filed: Sep. 3, 1982

[30] Foreign Application Priority Data

Nov. 6, 1981 [JP] Japan .................... 56-178163

[51] Int. Cl.³ .................... G05F 3/08; G05F 3/20; H03F 1/30
[52] U.S. Cl. .................... 307/297; 323/315; 323/317; 330/288
[58] Field of Search ............ 307/296 R, 297, 491; 323/312, 315–317; 330/288

[56] References Cited

U.S. PATENT DOCUMENTS

| | | | |
|---|---|---|---|
| 3,911,353 | 10/1975 | Plassche | 307/297 X |
| 3,936,725 | 2/1976 | Schneider | 330/288 X |
| 4,323,854 | 4/1982 | Hester | 307/296 R |
| 4,350,904 | 9/1982 | Cordell | 307/297 X |
| 4,414,502 | 11/1983 | Wong | 323/315 |
| 4,435,678 | 3/1984 | Joseph et al. | 323/315 X |

OTHER PUBLICATIONS

Nedungadi, "Accurate Submicroampere Controlled Current Source"; Electronic Letters (vol. 17, No. 9), 4/30/81; pp. 320–322.

Van Kessel et al., "Integrated Linear Basic Circuits", vol. 32, No. 1, Philips Tech. Rev. 1-12 (1971).

Primary Examiner—Larry N. Anagnos
Attorney, Agent, or Firm—Finnegan, Henderson, Farabow, Garrett & Dunner

[57] ABSTRACT

A series circuit consisting of the emitter-collector path of a first transistor of npn type and an input current source is connected between a negative voltage source and a positive voltage source. Another series circuit consisting of the emitter-collector path of a second transistor of npn type and the collector-emitter path of a fourth transistor of pnp type is also connected between the negative and positive voltage sources. A further series circuit consisting of a first resistor, the emitter-collector path of a third transistor of npn type, a second resistor, and the collector-emitter path of a fifth transistor of pnp type is connected between the negative and positive voltage sources. The second and third transistors have their bases connected together. The fourth and fifth transistors have their bases connected together. The collector of the first transistor is connected to the base of the fifth transistor. The base of the first transistor is connected to the emitter of the sixth transistor. A seventh transistor has the emitter connected to the negative voltage source, the base connected to the collector of the third transistor and the collector connected to an output current terminal. The fourth and fifth transistors have an equal emitter area, and the ratio of the emitter area of the third transistor to the emitter area of the second transistor is set to $m(m>1)$. The ratio of the output current to that of the current source is less than unity. This ratio is determined solely by the ratio m and the ratio between the resistances of the first and second resistors and is free from any temperature coefficient.

4 Claims, 10 Drawing Figures

F I G. 3
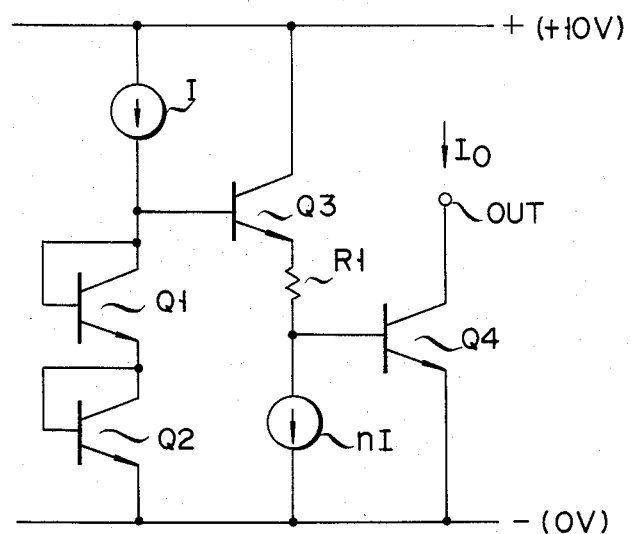

CURRENT SOURCE CIRCUIT FOR PRODUCING A SMALL VALUE OUTPUT CURRENT PROPORTIONAL TO AN INPUT CURRENT

BACKGROUND OF THE INVENTION

This invention relates to a current source circuit in which bipolar transistors are arranged such that the ratio of the output current to the input current can be precisely set to a desired value.

U.S. Pat. No. 3,320,439 discloses a circuit which is a bipolar IC (integrated circuit), as shown in FIG. 1, which converts an input current into an output current of a desired small value. In the circuit of FIG. 1, if the input current $I_1$ is 100 μA and the output current $I_2$ is 0.1 μA, the resistance of resistor R, which is given as $(V_T/I_2)\cdot\ln(I_1/I_2)$, is 1.8 MΩ, $V_T$ being the thermionic voltage. With the present bipolar IC techniques, however, it is difficult to realize a resistance in excess of 1 MΩ precisely. Therefore, the desired output current $I_2$ cannot be obtained with high precision.

FIG. 2 shows another well-known circuit. In the circuit of FIG. 2, if a current of 100 μA is directed to the emitter of the bipolar transistor and the grounded emitter current amplification factor $\beta$ is 100, the base current $I_B=(1/\beta)I$ is 1 μA. The precision of this base current $I_B$, however, is inferior, as it depends upon the current amplification factor $\beta$. According to current bipolar IC technology, the current amplification factor $\beta$ ranges approximately from 100 to 500. Therefore, it has been very difficult to obtain a current source circuit which can provide an output current of a small value, typically less than one microampere, using the conventional bipolar IC technology.

To overcome this deficiency, the inventor has developed a current source circuit which can provide a small current (less than one microampere) with high precision. This circuit has a basic construction as shown in FIG. 3. However, the ratio of the output current $I_0$ to the input current I of this current source circuit, i.e., the amplification factor of the circuit, depends upon temperature. Therefore, the precision of the output current is still not perfectly satisfactory. The circuit of FIG. 3 will be described in order to facilitate the understanding of the invention.

Referring to FIG. 3, a current source of input current I and transistors Q1 and Q2 are provided in series between a high potential point (+) (for instance, at 10 V) and a low potential point (−) (for instance, at ground potential). Another series circuit, which consists of a transistor Q3, a resistor R1 and a current source which provides a current of nI (n being a positive integer), is provided between the high potential point (+) and the low potential point (−). Further, a transistor Q4 is connected between the low potential point (−) and an output terminal OUT, from which the output current $I_0$ is provided. The transistors Q1 and Q2 each have their collector and base connected to each other. The collector of the transistor Q1 is connected to the base of the transistor Q3. The junction between the transistor R1 and the current source of the current nI is connected to the base of the transistor Q4. The transistors Q1 to Q4 have respective emitter areas m1 to m4, which are set to be m1>m3, m1>m4, m2>m3 and m2>m4, that is, m3=m4=1=A and m1=m2=m=mA.

Assuming that the grounded emitter amplification factor $\beta$ of each of the transistors in FIG. 3 is sufficiently large, for the closed loop including the transistors Q1 to Q4 and resistor R1 there holds a relation $$V_{BE}(Q2)+V_{BE}(Q1)=V_{BE}(Q4)+nI\cdot R1+V_{BE}(Q3) \quad (1)$$

where $V_{BE}$ is the voltage across the base-emitter path of the relevant transistor. Meanwhile, the base-emitter voltage $V_{BE}$ on each transistor and the collector current $I_C$ thereof are related as $$V_{BE} = V_T \cdot \ln \frac{I_C}{m \cdot I_S} \quad (2)$$

where $V_T$ is the thermionic voltage, m is the ratio between the emitter area of each of the transistors Q1 and Q2 and the emitter area of each of the transistors Q3 and Q4, and $I_S$ is the reverse biased saturation current of the transistors. Substitution of the equation (1) into the equation (2) yields an equation $$V_T \cdot \ln \frac{I}{m1 \cdot I_S} + V_T \cdot \ln \frac{I}{m2 \cdot I_S} = \quad (3)$$

$$V_T \cdot \ln \frac{I_0}{m4 \cdot I_S} + nI \cdot R1 + V_T \cdot \ln \frac{nI}{m3 \cdot I_S}$$

Since m1=m2=m and m3=m4=1, from the equation (3) we obtain $$2 \cdot V_T \cdot \ln \frac{I}{m \cdot I_S} = V_T \cdot \ln \frac{I_0}{I_S} + nI \cdot R1 + V_T \cdot \ln \frac{nI}{I_S} \quad (4)$$

From the equation (4) we obtain $$I_0 = \frac{I}{m^2 n} e^{-\frac{nI \cdot R1}{V_T}} \quad (5)$$

The equation (5) means that the output current $I_0$ from the transistor Q4 is determined by the transistor emitter area ratio m, the current source current ratio n and the resistance of the resistor R1. The resistance of the resistor R1 need not be of a high value as mentioned in connection with FIG. 1. Thus, the current source circuit can be readily obtained as a bipolar transistor integrated circuit. In addition, a small current of the order of 0.1 μA can be obtained with high precision. Further, the magnitude of the output current $I_0$ can be readily adjusted by suitably selecting the resistance of the resistor R1. In the circuit of FIG. 3, the ratio of the output current $I_0$ to the input current I, i.e., the amplification factor G of the circuit, is given as $$G = \frac{1}{m^2 n} e^{-\frac{nI \cdot R1}{V_T}} \quad (6)$$

As is obvious from the equation (6), the current amplification factor G depends upon temperature due to the thermionic voltage $V_T$.

SUMMARY OF THE INVENTION

An object of the invention, accordingly, is to provide a current source circuit, with which the ratio of the output current to the input current can be freely set and which can also be free from the temperature dependency of the output current.

Additional objects and advantages of the invention will be set forth in part in the description which follows, and in part will be obvious from the description, or may be learned by practice of the invention. The objects and advantages of the invention may be realized and attained by means of the instrumentalities and combinations particularly pointed out in the appended claims.

To achieve the objects and according to the purpose of the invention, as embodied and broadly described herein, there is provided a current source circuit, which comprises a first transistor of a first conductivity type with the emitter connected to a first potential point and the collector connected to a second potential point through an input current source; a second transistor of the first conductivity type with the emitter coupled to the first potential point and the base and collector connected to each other; a third transistor of the first conductivity type with the emitter coupled to the first potential point and the base connected to the base of the second transistor, the second and third transistors constituting a first current mirror circuit; a fourth transistor of a second conductivity type with the emitter coupled to the second potential point and the collector connected to the collector of the second transistor; a fifth transistor of the second conductivity type with the emitter coupled to the second potential point, the base and collector connected to each other and the base connected to the base of the fourth transistor, the fourth and fifth transistors constituting a second current mirror circuit; means for connecting the emitter of one of the second to fifth transistors to a corresponding potential point through a first resistor; a sixth transistor of the first conductivity type with the collector connected to the collector of the fifth transistor, the emitter connected to the collector of the third transistor through a second resistor and the base coupled to the collector of the first transistor; a seventh transistor of the first conductivity type with the emitter connected to the first potential point and the collector connected to an output terminal, from which an output current is provided; means for connecting one terminal of the second resistor to the base of the first transistor and the other terminal to the base of the seventh transistor; and the ratio of the emitter area of the aforementioned one of the second to fifth transistors having the emitter connected to the first resistor to the emitter area of the transistor constituting a current mirror circuit together with the aforementioned one of the second to fifth transistors being set to m (m<1), said output current being determined by said ratio m and the ratio of the resistance of the second resistor to the resistance of the first resistor.

BRIEF DESCRIPTION OF THE DRAWINGS

FIG. 3 is a circuit diagram showing a current source circuit presented here for facilitating the understanding of the invention;

DETAILED DESCRIPTION OF THE PREFERRED EMBODIMENTS

Figure 1:
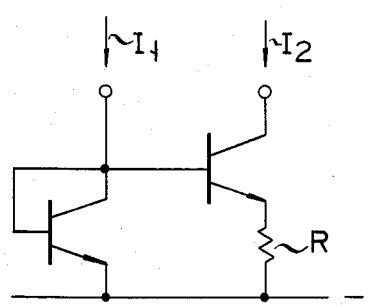
FIGS. 1 and 2 are circuit diagrams showing respective prior art current source circuits.
Figure 2:
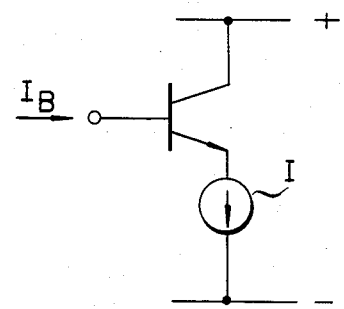
Figure 4:
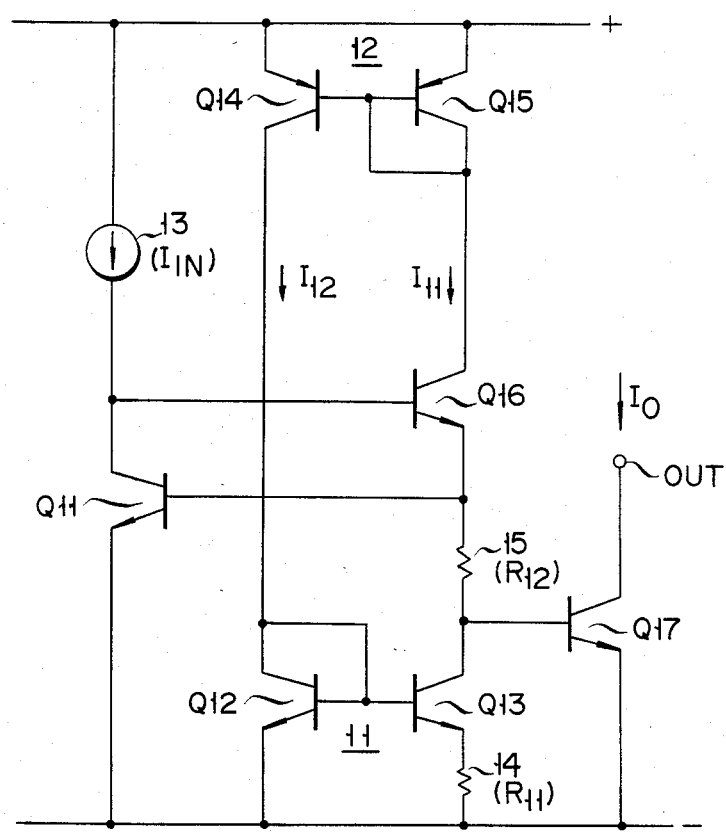
FIG. 4 is a circuit diagram showing a first embodiment of the invention.

FIG. 4 shows an embodiment of the current source circuit, in which the ratio of output current $I_0$ to input current $I_{IN}$, i.e., the current amplification factor G, is less than unity. Referring to the Figure, a first transistor Q11, which is an npn transistor, has the emitter connected to a low potential point (−), for instance at 0 V, and has its collector connected to a high potential point (+), for instance at +10 V, through a current source 13, the input current of which is $I_{IN}$. A second transistor Q12, which is also an npn transistor, has the emitter connected to the low potential point (−) and the collector and base connected to each other. A third transistor Q13, which is again an npn transistor, has its emitter connected to the low potential point (−) through a first resistor 14, the resistance of which is $R_{11}$, and has the base connected to the base of the second transistor Q12. The second and third transistors Q12 and Q13 constitute a first current mirror 11.

A fourth transistor Q14, which is a pnp transistor, has the emitter connected to the high potential point (+) and the collector connected to the collector of the second transistor Q12. A fifth transistor Q15, which is also a pnp transistor, has the emitter connected to the high potential point (+), the base connected to the base of the fourth transistor Q14 and the base and collector connected to each other. The fourth and fifth transistors Q14 and Q15 constitute a second current mirror 12. A sixth transistor Q16, which is an npn transistor, has the collector connected to the collector of the fifth transistor Q15, the base connected to the collector of the first transistor Q11 and the emitter connected to the base of the first transistor Q11 and also connected to the collector of the third transistor Q13 through a second resistor 15, the resistance of which is $R_{12}$. A seventh transistor Q17, which is an npn transistor, has the emitter connected to the low potential point (−), the collector connected to an output terminal OUT, from which the output current $I_0$ is provided, and the base connected to the collector of the third transistor Q13. The fourth and fifth transistors Q14 and Q15 have an equal emitter area. The third transistor Q13 has an emitter area equal to m times (m<1) the emitter area of the second transistor Q12.

The operation of the circuit of FIG. 4 will now be described. If the grounded emitter amplification factor $\beta$ of the transistors Q14 and Q15 is sufficiently large, the input current $I_{11}$ to the current mirror 12 is equal to the output current $I_{12}$ from this current mirror. Also, if the grounded emitter amplification factor $\beta$ of the transistors Q11, Q16 and Q17 is sufficiently large and the base currents to these transistors are negligibly small, the collector current in the transistor Q13 is equal to the collector current in the transistor Q16. In this case, since the bases of the transistors Q12 and Q13 are connected and held at an equal potential, the base-emitter voltage $V_{BE}(Q12)$ of the transistor Q12 is equal to the sum of the base-emitter voltage $V_{BE}(Q13)$ of the transistor Q13 and the voltage drop $R_{11} \cdot I_{11}$ across the resistor 14. Mathematically, there holds a relation $$V_{BE}(Q12) = V_{BE}(Q13) + R_{11} \cdot I_{11} \quad (7)$$

Substitution of the equation (2) (relating $V_{BE}$ and $I_C$ of transistor in the active region) into the equation (7) yields an equation $$V_T \cdot \ln \frac{I_{12}}{I_S} = V_T \cdot \ln \frac{I_{11}}{m \cdot I_S} + R_{11} \cdot I_{11} \quad (8)$$

From the equation (8) we obtain $$I_{11} = I_{12} = (V_T/R_{11}) \cdot \ln m \quad (9)$$

This means that the current flowing in the collector of the transistor Q13 is proportional to the thermionic voltage $V_T$.

Since the current $I_{11}$ given by the equation (9) flows through the resistor 15, the base-emitter voltage $V_{BE}(Q11)$ of the transistor Q11 is equal to the sum of the base-emitter voltage $V_{BE}(Q17)$ of the transistor Q17 and the voltage drop $R_{12} \cdot I_{11}$ across the resistor 15. Mathematically, there holds a relation $$V_{BE}(Q11) = V_{BE}(Q17) + R_{12} \cdot I_{11} \quad (10)$$

Since the collector current in the transistor Q11 is $I_{IN}$ and the collector current in the transistor Q17 is $I_0$, substitution of the equations (2) and (9) into the equation (10) yields an equation $$V_T \cdot \ln \frac{I_{IN}}{I_S} = \frac{R_{12}}{R_{11}} V_T \cdot \ln m + V_T \cdot \ln \frac{I_0}{I_S} \quad (11)$$

Rearranging the equation (11) for the amplification factor G of the current source circuit, we obtain $$G = \frac{I_0}{I_{IN}} = e^{-\frac{R_{12}}{R_{11}} \cdot \ln m} \quad (12)$$

Since $m < 1$ as mentioned before, G has a value less than unity.

As is obvious from the equation (12), which is irrelevant to the thermionic voltage $V_T$, the amplification factor G of the current source circuit shown in FIG. 4, i.e., $I_0/I_{IN}$, is determined solely by the ratio m of the emitter area of the transistor Q13 to the emitter area of the transistor Q12 and the ratio of $R_{12}$ to $R_{11}$. Since in the bipolar IC resistors of the same construction have an equal temperature coefficient, the current amplification factor G is absolutely free from any temperature coefficient. In addition, the resistance ratio $R_{12}/R_{11}$ and the emitter area ratio m can be freely and readily set to desired values to make the value of the output current $I_0$ very small.

Further, no particular circuit is needed to start the current source circuit. That is, when predetermined potentials are given to the low and high potential points (−) and (+), a balanced state of the current source circuit automatically sets in. More particularly, current from the input current source 13 flows through the base-emitter paths of the transistors Q16 and Q11. As a result, the collector current $I_{11}$ in the transistor Q16 is induced and the induced current $I_{11}$ flows as an input current to the current mirror 12, thus causing the collector current $I_{12}$ to flow through the transistor Q14. This collector current $I_{12}$ constitutes an input current to the current mirror circuit 11 to cause a collector current to flow through the transistor Q13. The collector current in the transistor Q13 constitutes again the input current to the transistor Q15. In other words, a closed loop is formed, in which current flows from the transistor Q15 through the transistors Q14, Q12 and Q13 back to the transistor Q15. Once the currents $I_{11}$ and $I_{12}$ in this closed loop are determined, the base-emitter voltage $V_{BE}$ of the transistor Q17 is determined to obtain a constant output current $I_0$.

Figure 5:
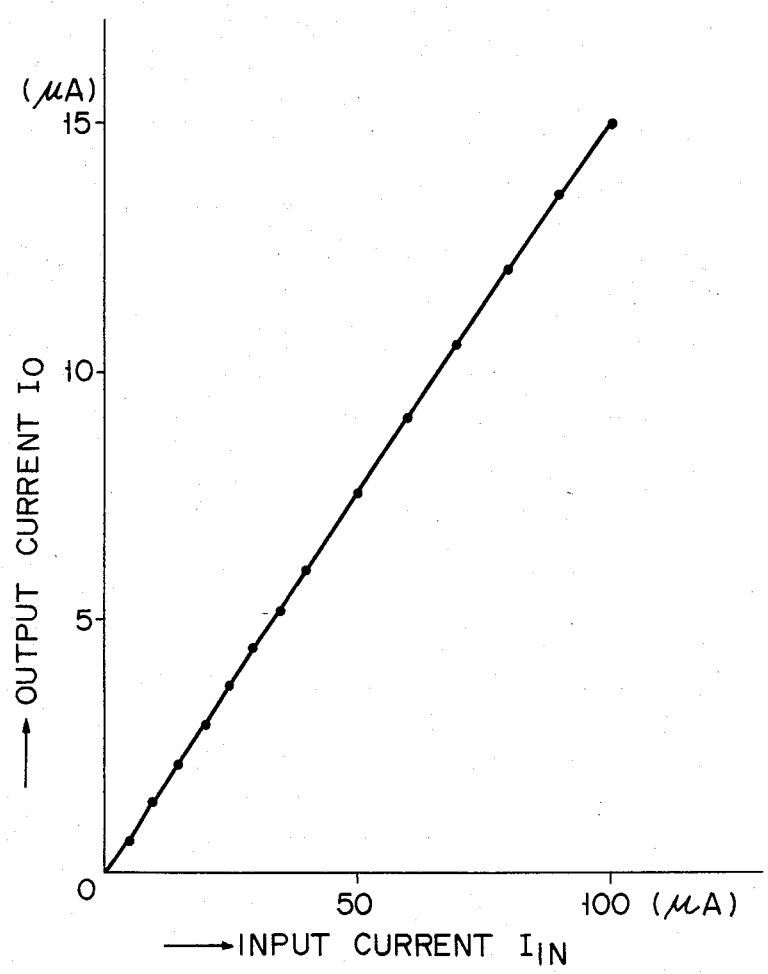
FIG. 5 is a graph showing the relation between the output current and input current of the first embodiment.

FIG. 5 shows the relation between the output current $I_0$ and input current $I_{IN}$ to the current source 13 of FIG. 4. The graph was obtained by setting the ratio of the emitter area of the transistor Q13 to the emitter area of the transistor Q12 to 2, the resistance $R_{11}$ of the resistor 14 to 179 Ω, the resistance $R_{12}$ of the resistor 15 to 594 Ω, the potential on the high potential point (+) to +5 V and the potential on the low potential point (−) to 0 V. The currents $I_{11}$ and $I_{12}$ were set to be $I_{11} = I_{12} \approx 100$ μA. The input current $I_{IN}$ was varied from 0 to 100 μA.

Figure 6:
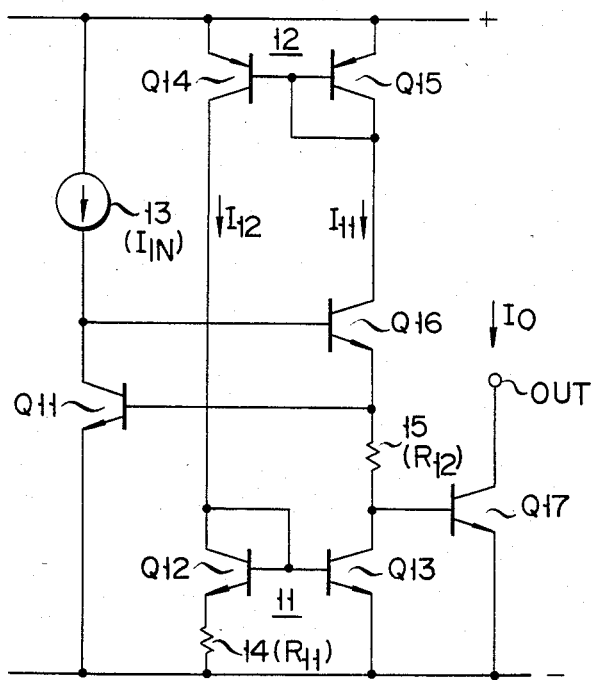
FIG. 6 is a circuit diagram showing a second embodiment of the invention.
Figure 7:
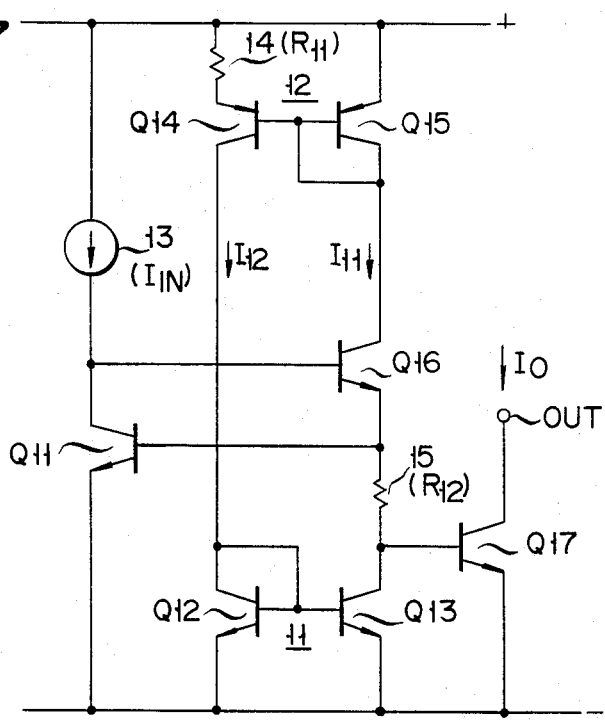
FIG. 7 is a circuit diagram showing a third embodiment of the invention.
Figure 8:
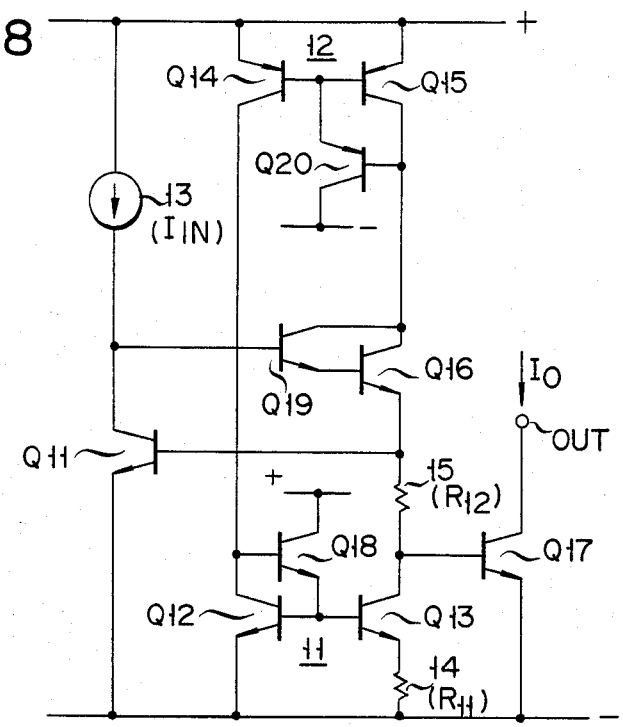
FIG. 8 is a circuit diagram showing a fourth embodiment of the invention.

FIGS. 6 to 8 show different embodiments of the current source circuits, in which the current amplification factor G is less than unity.

The embodiment of FIG. 6 is the same as the preceding embodiment of FIG. 4 except that the first resistor 14 is connected between the emitter of the second transistor Q12 and the low potential point (−), and that the emitter area of the second transistor Q12 is set to be m times (m < 1) the emitter area of the third transistor Q13. Like the embodiment of FIG. 4, the transistors Q14 and Q15 have an equal emitter area. In this circuit, the collector currents in the transistors Q12 and Q13 are equal so that the equation (9) holds. That is, the current amplification factor G is free from any temperature coefficient.

The embodiment of FIG. 7 is the same as the embodiment of FIG. 4 except that the first resistor 14 is connected between the emitter of the fourth transistor Q14 and the high potential point (+), that the emitter area of the fourth transistor Q14 is set to be m times (m < 1) the emitter area of the fourth transistor Q15, and that the transistors Q12 and Q13 have an equal emitter area. Again in this embodiment the collector currents in the transistors Q12 to Q15 are equal so that the equation (9) holds. Thus, a current amplification factor G free from any temperature coefficient can be obtained.

As an alternative to the arrangement of FIG. 7, it is possible to connect the first resistor 14 between the emitter of the fifth transistor Q15 and the high potential point (+), set the emitter area of the transistor Q15 to be m times the emitter area of the transistor Q14 and set the emitter areas of the transistors Q12 and Q13 to be equal. This alternative arrangement is not shown.

In the embodiment of FIG. 8, an npn transistor Q18, a pnp transistor Q20 and an npn transistor Q19 are connected in the illustrated manner. This is done in order to compensate the collector currents in the first and second current mirror circuits 11 and 12 and in the sixth transistor Q16 for errors due to the base currents. The transistor Q18 is provided for the first current mirror circuit 11, with its collector connected to the high potential point (+) and its base-emitter path connected across the base-collector path of the transistor Q12. The transistor Q20 is provided for the second current mirror circuit 12, with its collector connected to the low potential point (−) and its base-emitter path connected across the base-collector path of the transistor Q15. The transistor Q19 is provided or the transistor Q16, with its base connected to the collector of the transistor Q11 and its collector-emitter path connected across the collector-base path of the transistor Q16.

Figure 9:
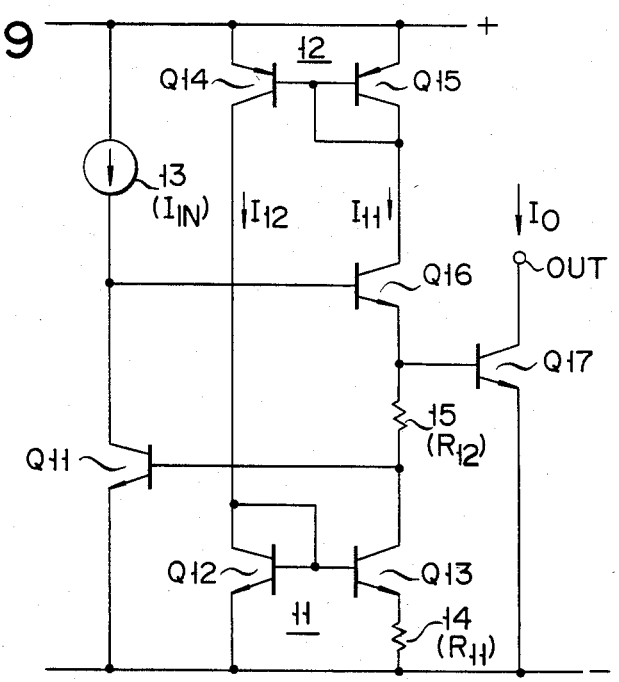
FIG. 9 is a circuit diagram showing a fifth embodiment of the invention.
Figure 10:
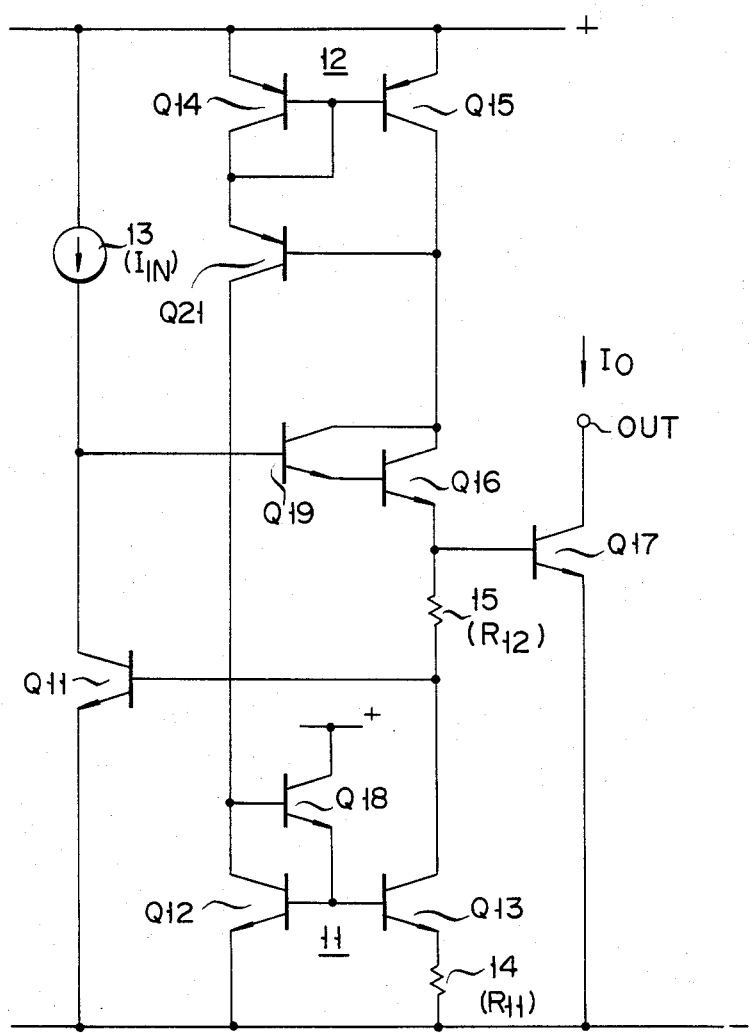
FIG. 10 is a circuit diagram showing a sixth embodiment of the invention.

FIGS. 9 and 10 show further embodiments of the current source circuit, in which the amplification factor G is greater than unity. The embodiment of FIG. 9 is different from the embodiment of FIG. 4 in that the base of the first transistor Q11 is connected to the junction between the collector of the third transistor Q13 and the second resistor 15 and that the base of the seventh transistor Q17 is connected to the junction between the emitter of the sixth transistor Q16 and the second resistor 15. In this embodiment we can obtain an equation $$V_{BE}(Q11) + R_{12} \cdot I_{11} = V_{BE}(Q17) \tag{13}$$

which corresponds to the equation (10). Also, we can obtain an equation $$V_T \cdot \ln \frac{I_{IN}}{I_S} + \frac{R_{12}}{R_{11}} V_T \cdot \ln m = V_T \cdot \ln \frac{I_0}{I_S} \tag{14}$$

which corresponds to the equation (11). Rearranging the equation (14) for the current amplification factor G, $$G = \frac{I_0}{I_{IN}} = e^{\frac{R_{12}}{R_{11}} \ln m} \tag{15}$$

From the equation (15) it is seen that G is greater than unity. It is also obvious from the equation (15) that the current amplification factor G is independent of any temperature coefficient. The output current $I_O$ is thus determined solely by the ratio $R_{12}/R_{11}$ and the ratio m of the emitter area of the transistor Q13 to the emitter area of the transistor Q12.

The embodiment of FIG. 10 is the same as the embodiment of FIG. 9 except that transistors Q18, Q19 and Q21 are provided to compensate for errors in collector currents in the first and second current mirror circuits 11 and 12 and the sixth transistor Q16 due to base currents. The transistor Q18, which is an npn transistor Q18, has the collector connected to the high potential point (+) and the base-emitter path connected across the collector-base path of the transistor Q12. The transistor Q21 has the emitter-collector path connected between the collector of the transistor Q12 and the collector of the transistor Q14 and the base connected to the collector of the transistor Q15. The transistor Q19 has the collector-emitter path connected across the collector-base path of the transistor Q16 and the base connected to the collector of the transistor Q11.

The embodiments described above according to the invention are by no means limitative, and various changes and modifications can be made. For example, the first resistor 14 in the embodiment of FIG. 9 may be connected to the emitter of a different transistor as in the embodiment of FIG. 6 or 7.

What is claimed is:

1. A current source circuit comprising:
a first transistor of a first conductivity type with the emitter connected to a first potential point and the collector connected to a second potential point through an input current source;
a second transistor of the first conductivity type with the emitter coupled to the first potential point and the base and collector connected to each other;
a third transistor of the first conductivity type with the emitter coupled to the first potential point and the base connected to the base of said second transistor, said second and third transistors constituting a first current mirror circuit;
a fourth transistor of a second conductivity type with the emitter coupled to said second potential point and the collector connected to the collector of said second transistor;
a fifth transistor of the second conductivity type with the emitter coupled to said second potential point, the base and collector connected to each other and the base connected to the base of said fourth transistor, said fourth and fifth transistors constituting a second current mirror circuit;
means for connecting the emitter of one of said second to fifth transistors to a corresponding potential point through a first resistor;
a sixth transistor of the first conductivity type with the collector connected to the collector of said fifth transistor, the emitter connected to the collector of said third transistor through a second resistor and the base coupled to the collector of said first transistor;
a seventh transistor of the first conductivity type with the emitter connected to said first potential point and the collector connected to an output terminal, from which an output current is provided;
means for connecting one terminal of said second resistor to the base of said first transistor and the other terminal to the base of said seventh transistor; and
the ratio of the emitter area of said one of the second to fifth transistors having the emitter connected to said first resistor to the emitter area of the transistor constituting a current mirror circuit together with said one of the second to fifth transistors being set to m (m < 1), said output current being determined by said ratio m and the ratio of the resistance of said second resistor to the resistance of said first resistor.

2. The current source circuit according to claim 1, wherein the base of said first transistor is connected to the junction between the emitter of said sixth transistor and said second resistor, the base of said seventh transistor being connected to the junction between the collector of said third transistor and said second resistor, and the ratio of the output current to the input current ($I_{IN}$) is set to be less than unity.

3. The current source circuit according to claim 1, wherein the base of said first transistor is connected to the junction between the collector of said third transistor and said second resistor, the base of said seventh transistor is connected to the junction between the emitter of said sixth transistor and said second resistor, and the ratio of the output current to the input current is set to be greater than unity.

4. The current source circuit according to claim 1, which further comprises means for compensating the errors of the collector currents in said first and second current mirror circuits and said sixth transistor, said errors being produced by base currents.

* * * * *